United States Patent
Kim (10) Patent No.: US 9,502,126 B1
(45) Date of Patent: Nov. 22, 2016

(54) MEMORY SYSTEM AND OPERATING METHOD THEREOF

(71) Applicant: SK hynix Inc., Gyeonggi-do (KR)

(72) Inventor: Dong Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/050,650

(22) Filed: Feb. 23, 2016

(30) Foreign Application Priority Data

Sep. 10, 2015 (KR) .................. 10-2015-0128307

(51) Int. Cl.
*G11C 29/06* (2006.01)
*G11C 29/50* (2006.01)
*G11C 16/26* (2006.01)

(52) U.S. Cl.
CPC .............. *G11C 16/26* (2013.01); *G11C 29/06* (2013.01); *G11C 2029/5004* (2013.01)

(58) Field of Classification Search
CPC ............................................. G11C 2029/5004
USPC ........................................................ 365/201
See application file for complete search history.

(56) References Cited

U.S. PATENT DOCUMENTS

2005/0226055 A1* 10/2005 Guterman .............. G11C 16/12
365/185.28
2008/0298127 A1* 12/2008 Kim ................... G11C 16/0483
365/185.17

FOREIGN PATENT DOCUMENTS

KR 1020080057385 6/2008
KR 1020130022228 3/2013

* cited by examiner

*Primary Examiner* — Hoai V Ho
*Assistant Examiner* — Jay Radke
(74) *Attorney, Agent, or Firm* — IP & T Group LLP (57) ABSTRACT

A method of operating a semiconductor memory device includes applying a read voltage to a selected word line on which a program operation is performed; applying a first pass voltage to at least one unselected word line adjacent to the selected word line; applying a second pass voltage to the at least one unselected word line when a first reference time elapses; and performing a read operation on memory cells connected to the selected word line according to the read voltage when a second reference time elapses.

17 Claims, 9 Drawing Sheets

MEMORY SYSTEM AND OPERATING METHOD THEREOF

CROSS-REFERENCE TO RELATED APPLICATION

The present application claims priority to Korean patent application number 10-2015-0128307, filed on Sep. 10, 2015, the entire disclosure of which is herein incorporated by reference in its entirety.

BACKGROUND

1. Field

An aspect of the present disclosure relates to an electronic device, and more particularly, to a memory system and an operating method thereof.

2. Description of the Related Art

A semiconductor memory device is a memory device implemented using a semiconductor such as silicon (Si), germanium (Ge), gallium arsenide (GaAs), indium phosphide (InP), etc. The semiconductor memory device is generally classified into either a volatile memory device or a nonvolatile memory device.

The volatile memory is a memory device which loses stored data when a power supply is cut off. Examples of the volatile memory include a static random access memory (SRAM), a dynamic RAM (DRAM), a synchronous DRAM (SDRAM), and the like. The nonvolatile memory is a memory device which retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a memory system and an operating method thereof, which can detect a progressive failure.

According to an aspect of the present disclosure, a method of operating a semiconductor memory device may include applying a read voltage to a selected word line on which a program operation is performed; applying a first pass voltage to at least one unselected word line adjacent to the selected word line; applying a second pass voltage to the at least one unselected word line when a first reference time elapses; and performing a read operation on memory cells connected to the selected word line according to the read voltage when a second reference time elapses.

The first pass voltage may be equal to or higher than the read voltage.

The second pass voltage may be higher than the first pass voltage by a reference voltage.

The first reference time may be an enough time for the selected word line and the at least one unselected word line to be charged with the read voltage and the first pass voltage, respectively.

The second reference time may be an enough time for the selected word line to recover from a coupling effect between word lines and to return to the read voltage when the memory cells connected to the selected word line do not have any progressive failure.

According to an aspect of the present disclosure, a semiconductor memory device may include a memory cell array connected to a plurality of word lines; and a peripheral circuit suitable for performing a progressive failure detection operation to memory cells connected to a selected word line among the plurality of word lines, wherein the peripheral circuit applies a read voltage to a selected word line on which a program operation is performed; applies a first pass voltage to at least one unselected word line adjacent to the selected word line; applies a second pass voltage to the at least one unselected word line when a first reference time elapses; and performs a read operation to memory cells connected to the selected word line according to the read voltage when a second reference time elapses.

According to an aspect of the present disclosure, a method of operating a memory system may include performing a program operation to memory cells connected to a selected word line; and performing a progressive failure detection operation to the memory cells connected to the selected word line, wherein the performing of the progressive failure detection operation includes: applying a read voltage to the selected word line; applying a first pass voltage to at least one unselected word line adjacent to the selected word line; applying a second pass voltage to the at least one unselected word line when a first reference time elapses; and performing a read operation on the memory cells connected to the selected word line according to the read voltage when a second reference time elapses.

According to an aspect of the present disclosure, a method of operating a memory system may include performing a read operation to memory cells connected to a selected word line; and performing a progressive failure detection operation to the memory cells connected to the selected word line, wherein the performing of the progressive failure detection operation includes: applying a read voltage to the selected word line; applying a first pass voltage to at least one unselected word line adjacent to the selected word line; applying a second pass voltage to the at least one unselected word line when a first reference time elapses; and performing a read operation on the memory cells connected to the selected word line according to the read voltage when a second reference time elapses.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions of exemplary embodiments in accordance with a concept of the present disclosure which are disclosed in this specification are illustrated only to describe the exemplary embodiments in accordance with the concept of the present disclosure and the exemplary embodiments in accordance with the concept of the present disclosure may be carried out by various forms but the present disclosure is not limited to the exemplary embodiments described in this specification.

Various modifications and changes may be applied to the exemplary embodiments in accordance with the concept of the present disclosure so that the exemplary embodiments will be illustrated in the drawings and described in detail in the specification. However, the exemplary embodiments according to the concept of the present disclosure are not limited to the specific embodiments, but includes all changes, equivalents, or alternatives which are included in the spirit and technical scope of the present disclosure.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between," or "adjacent to" and "directly adjacent to" need to be interpreted by the same manner.

Terminologies used in the present specification are used only to describe specific exemplary embodiments, and are not intended to limit the present disclosure. A singular form may include a plural form when there is no clearly opposite meaning in the context. In the present specification, it should be understood that terms "include" or "have" indicate that a feature, a number, a step, an operation, a component, a part or the combination of those described in the specification is present, but do not exclude a possibility of presence or addition of one or more other features, numbers, steps, operations, components, parts or combinations thereof, in advance.

When it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning when they are not clearly defined in this specification.

Technical descriptions that are well known in the art to which the present disclosure pertains and are not directly connected with the present disclosure will be omitted as much as possible from the descriptions of the embodiments. This is for the purpose of communicating the features of the present disclosure more clearly by omitting unnecessary descriptions.

Hereinafter, the present disclosure will be described in detail by explaining exemplary embodiments of the present disclosure with reference to the accompanying drawings.

Figure 1:
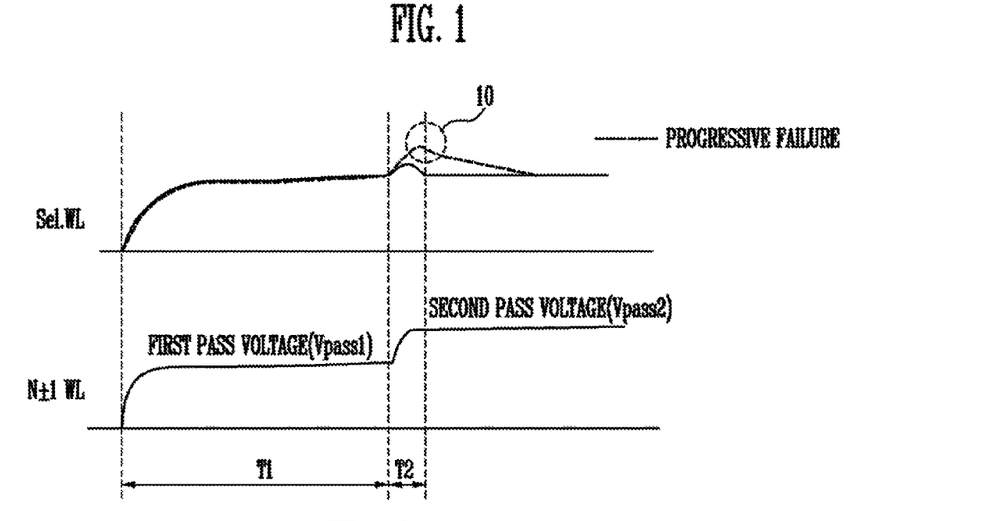
FIG. 1 is a diagram illustrating a method of detecting a progressive failure according to an embodiment of the present disclosure.

FIG. 1 is a diagram illustrating a method of detecting a progressive failure according to an embodiment of the present disclosure.

When the fabrication of a semiconductor memory device is completed, a test process is performed on the semiconductor memory device so as to check a fabrication state, performance, reliability, and the like of the semiconductor memory device. Although the semiconductor memory device passes the test process, a defect or failure may occur during later use of the semiconductor memory device. The defect or failure occurring during the later use of the semiconductor memory device is referred to as a progressive failure or progressive defect.

In the embodiment of the present disclosure, a method of detecting an area of a memory, in which it is likely that the progressive failure will occur during the test process and a method of processing the detected progressive failure during the use of the semiconductor memory device are described herein.

A method of determining whether it is likely that the progressive failure will occur by programming arbitrary data in a plurality of memory cells connected to a selected word line and reading the programmed data will be described with reference to FIG. 1.

Referring to FIG. 1, after a program operation is completed to memory cells, a read voltage Vread for a read operation may be applied to a selected word line of the programmed memory cells, and a first pass voltage Vpass1 may be applied to unselected word lines adjacent to the selected word line. The first pass voltage may be a voltage having a level equal to or higher than that of the read voltage.

The selected word line and the adjacent unselected word line are being charged with the read voltage and the first pass voltage, respectively, during a first reference time T1. After elapse of the first reference time T1, a second pass voltage Vpass2 is applied to the adjacent unselected word lines. The second pass voltage is higher than the first pass voltage.

Increase of the voltage level of the adjacent unselected word line may cause increase of the voltage level of the selected word due to a coupling effect between word lines. However, the read voltage is continuously applied to the selected word line. Therefore, when a predetermined time (e.g., a second reference time T2) elapses, the voltage level of the selected word line, which is normal, may be returned to the level of the read voltage, as indicated by a solid line in FIG. 1.

However, the voltage level of the selected word line having the possibility of the progressive failure may not be returned to the level of the read voltage even though the second reference T2 time elapses, as indicated by a dotted line and numerical reference 10 in FIG. 1. Therefore, when the memory cells connected to the selected word line are read at the elapse of the second reference time T2, a read fail may occur.

Read fail due to the progressive failure may occur when a conductive material forming the word lines is damaged or missing or not fully present. The word lines may include a metal silicide material. For example, the word line may include at least one selected from titanium silicide TiSix, tantalum silicide TaSix, tungsten silicide Wsix, cobalt silicide CoSix, nickel silicide NiSix, etc.

When a portion of a word line is damaged, the resistive path passes through a polysilicon layer at the damaged portion, and hence the resistive component of the word line at the rear of the damaged portion may be considerably increased. Therefore, the speed at which the voltage of the word line having the possibility of the progressive failure is returned to the original level from an increased level due to the coupling effect may be different from that of normal word lines.

Thus, it is possible to detect in advance the progressive failure that may occur during the later use of the semiconductor memory device.

Figure 2:
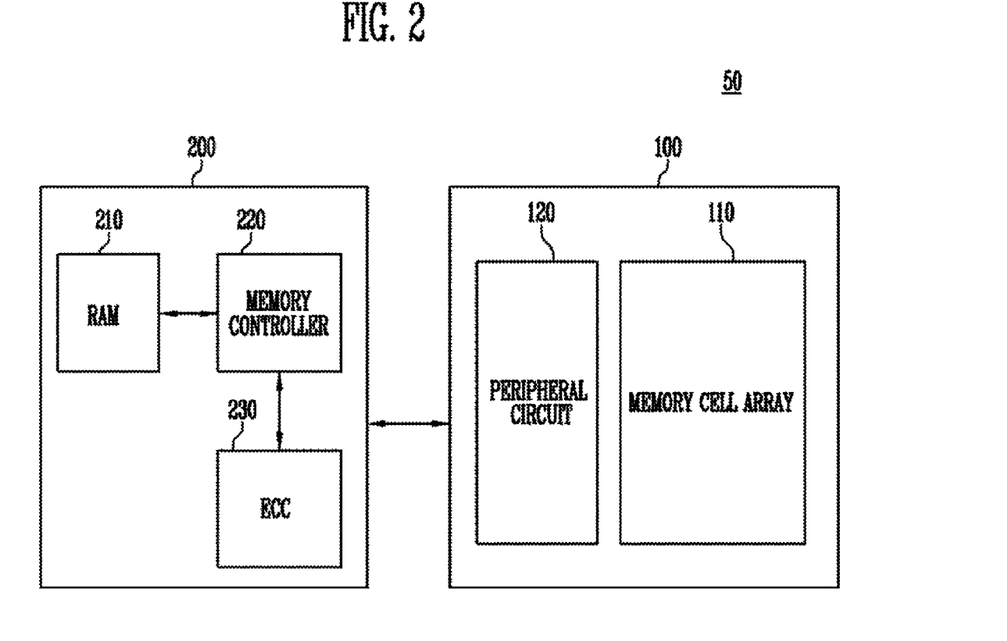
FIG. 2 is a block diagram illustrating a memory system according to an embodiment of the present disclosure.

FIG. 2 is a block diagram illustrating a memory system according to an embodiment of the present disclosure.

Referring to FIG. 2, the memory system 50 includes a semiconductor memory device 100 and a controller 200.

The semiconductor memory device 100 may be a NAND flash memory, a vertical NAND flash memory, a NOR flash memory, a resistive random access memory (RRAM), a phase-change random access memory (PRAM), a magneto-resistive random access memory (MRAM), a ferroelectric random access memory (FRAM), a spin transfer torque random access memory (STT-RAM), or the like. Also, the semiconductor memory device 100 of the present disclosure may be implemented in a three-dimensional array structure. The present disclosure may be applied not only to a flash memory device in which a charge storage layer is formed by a conductive floating gate but also to a charge trap flash memory in which a charge storage layer is formed of an insulation film.

The semiconductor memory device 100 includes a memory cell array 110 and a peripheral circuit 120 for driving the memory cell array 110. The memory cell array 110 includes a plurality of nonvolatile memory cells.

The memory cell array 110 includes a plurality of memory blocks BLK1 to BLKz, which may be divided into an OTP area, a system block, a user block, and the like according to their uses.

The peripheral circuit 120 operates under the control of the controller 200. The peripheral circuit 120 may program data in the memory cell array 110. The peripheral circuit 120 may operate to read data from the memory cell array 110 and erase data of the memory cell array 110.

In various embodiments, read and program operations of the semiconductor memory device 100 may be performed in units of pages. An erase operation of the semiconductor memory device 100 may be performed in units of blocks.

When a program operation is performed, the peripheral circuit 120 may receive, from the controller200, a program command indicating the program operation, a physical block address, and write data. When one memory block and one page included in the corresponding memory block are selected by the physical block address, the peripheral circuit 120 may program write data in the selected page.

When a read operation is performed, the peripheral circuit 120 may receive, from the controller 200, a read command indicating a read operation and a physical block address. The peripheral circuit 120 may read data from one memory block and one page included therein, which are selected according to the physical block address, and output the read data to the controller 200.

When an erase operation is performed, the peripheral circuit 120 may receive, from the controller 200, an erase command indicating the erase operation and a physical block address. The physical block address may specify one memory block. The peripheral circuit 120 may erase data of a memory block corresponding to the physical block address.

In various embodiments, when a program operation is performed, the peripheral circuit 120 may perform a progressive failure detection operation. The peripheral circuit 120 may transmit, to the controller 200, whether the progressive failure is detected according to the progressive failure detection operation.

The controller 200 controls overall operations of the semiconductor memory device 100. The controller 200 may access the semiconductor memory device 100 in response to the commands from an external host.

The controller 200 may include a random access memory (RAM) 210, a memory controller 220, and an error correction circuit (ECC) 230.

The RAM 210 operates under the control of the memory controller 220, and may be used as a work memory, a buffer memory, a cache memory, or the like. When the RAM 210 is used as the work memory, the RAM 210 may arbitrarily store data processed by the memory controller 220. When the RAM 210 is used as the buffer memory, the RAM 210 may be used to buffer data to be transmitted from a host (not shown) to the semiconductor memory device 100 or from the semiconductor memory device 100 to the host. When the RAM 210 is used as the cache memory, the RAM 210 may allow the semiconductor memory device 100 at a low speed to operate at a high speed.

The memory controller 220 is configured to control read, program, erase, and background operations of the semiconductor memory device 100. The memory controller 220 is configured to drive firmware for controlling the semiconductor memory device 100.

The memory controller 220 may translate a logical address provided from the host to a physical address through a flash translation layer (FTL) (not shown). Specifically, the FTL may receive a logical address, and translate the provided logical address to a physical address using a mapping table. The logical address may be a logical block address, and the physical address may be a physical page number. There are various address mapping methods of the FTL according to mapping units. Representative address mapping methods include a page mapping method, a block mapping method, and a hybrid mapping method.

When the memory controller 220 receives, from the semiconductor memory device 100, information that the progressive failure has been detected, the memory controller 220 performs a failure processing on the physical address of an area in which the progressive failure is detected, and searches logical address information mapped to the physical address of the area in which the progressive failure is detected, thereby changing the mapped physical address. The memory controller 220 may update the mapping table to store the changed physical address.

In an embodiment, the memory controller 220 may separately store, in a bad block table, information on the area in which the progressive failure is detected. The memory controller 220 controls the semiconductor memory device 100 to re-perform a program operation (i.e., to perform a re-program operation) by transmitting the changed physical address and a program command to the semiconductor memory device 100. In this case, the re-program operation may be performed on a physical address corresponding to a progressive failure-free memory block.

According to the embodiment of the present disclosure, it is possible to detect the progressive failure for each word line. Thus, when a progressive failure is detected, the failure processing can be performed in units of pages. In various embodiments, the failure processing may be performed on the entire memory block including a page in which a progressive failure is detected. When the failure processing is performed on the entire memory block including a page in which a progressive failure is detected, the memory controller 220 may control the memory device 100 to move the data, which is previously stored in an area of the entire memory block other than the page of the progressive failure, to another memory block.

The ECC 230 generates parity data as an error correction code for data to be programmed. Also, the ECC may correct an error of read data by using parity.

In various embodiments, the ECC 230 may generate parity of each unit data by dividing data to be programmed into a plurality of storage units (i.e., chunks). Alternatively, the ECC 230 may generate parity of the entire data to be programmed.

In a program operation, when the ECC 230 generates write data having a parity bit added thereto by generating parity and transmits the generated write data to the memory controller 220, the memory controller 220 transmits a program command, the write data, and a physical address to the semiconductor memory device 100.

In a read operation, the semiconductor memory device 100 reads data from a page of a selected physical address in response to a read command, and transmits the read data to the controller 200.

The ECC 230 detects an error included in the read data under the control of the memory controller 220. The ECC 230 may correct the error by using parity. The ECC 230 may correct an error by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, Hamming code, etc.

Generally, as the number of bits of parity increases, an error correction capacity increases and the number of bits of correctable error increases. Therefore, a larger number of error bits may be corrected in the read data having larger error correction capacity. When a greater number of error bits than the error correction capacity are included in the read data, ECC decoding to the read data may fail. When a lesser number of error bits than the error correction capacity are included in the read data, the ECC decoding to the read data may succeed.

The success in the ECC decoding represents that a corresponding read command passes. The failure in the ECC decoding represents that the corresponding read command fails. When the ECC decoding succeeds, the controller 200 outputs the error corrected data to the host.

Figure 3:
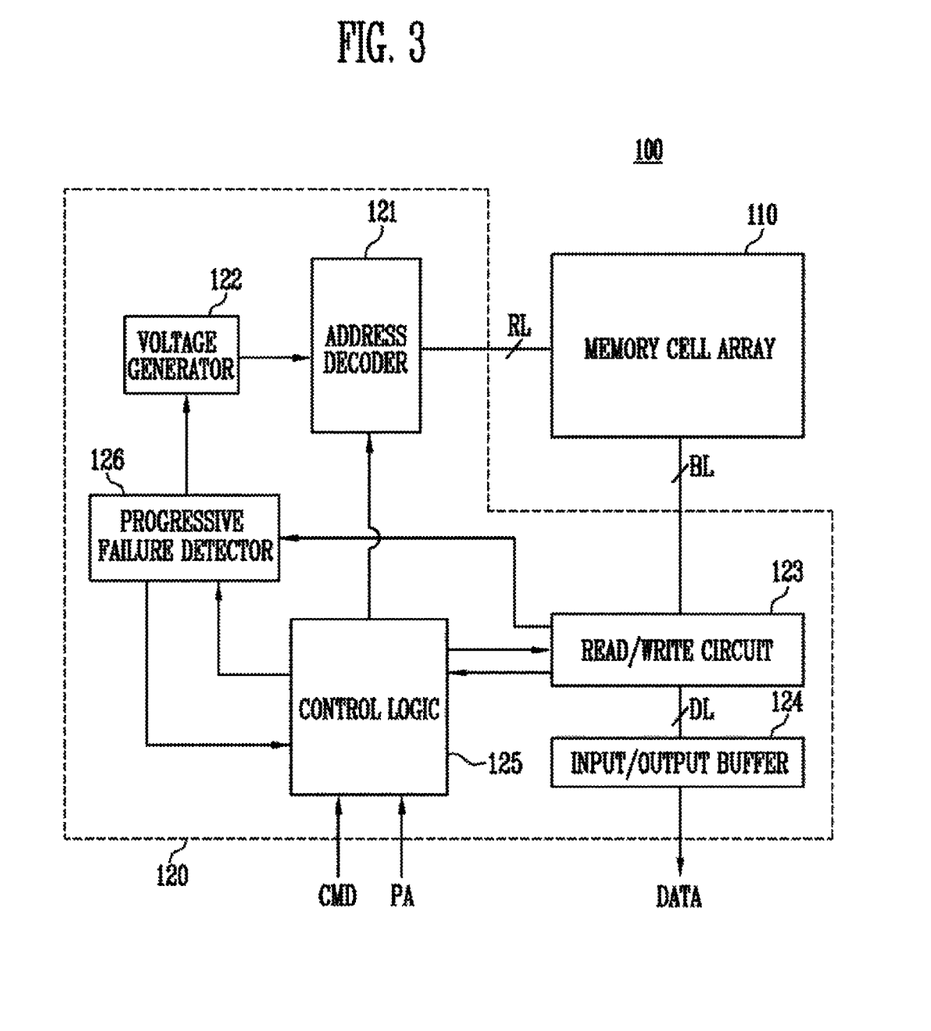
FIG. 3 is a block diagram illustrating a structure of a semiconductor memory device of FIG. 2.

FIG. 3 is a block diagram illustrating a structure of the semiconductor memory device 100 of FIG. 2.

Figure 4:
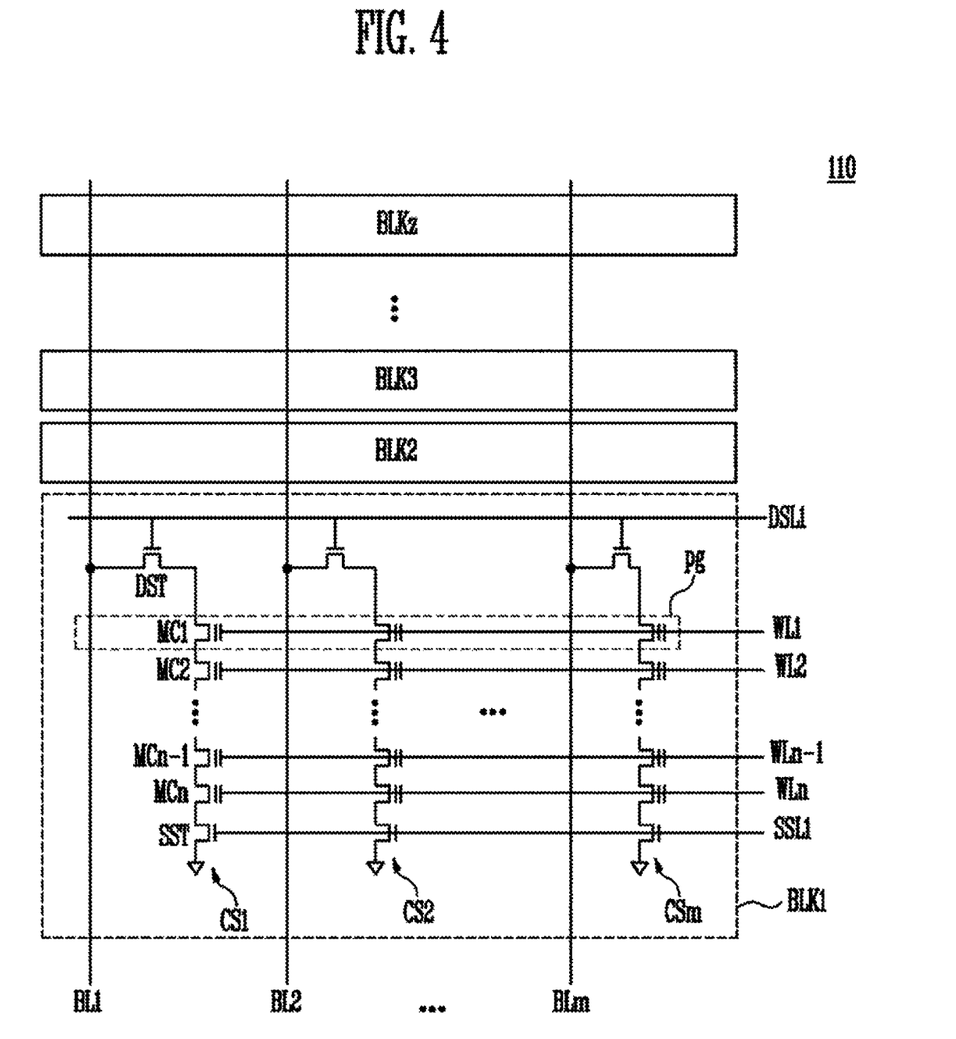
FIG. 4 is a diagram illustrating a structure of a memory cell array of FIG. 2.

FIG. 4 is a diagram illustrating a structure of the memory cell array 110 of FIG. 2.

Referring to FIG. 3, the semiconductor memory device 100 includes a memory cell array 110 and a peripheral circuit 120.

Referring to FIG. 4, the memory cell array 110 includes a plurality of memory blocks BLK1 to BLKz connected to an address decoder 121 through row lines RL and connected to a read/write circuit 123 through bit lines BL1 to BLm. Each of the plurality of memory blocks BLK1 to BLKz includes a plurality of memory cells. As an embodiment, the plurality of memory cells may be nonvolatile memory cells.

The memory cell array 110 may include a plurality of blocks. The plurality of blocks may include a main block and an extra block. Various setting information on operations of the memory cells may be stored in the extra block. As an embodiment, the extra block may include a content-addressable memory (CAM) area. The CAM area may store various setting information for overall operations of the semiconductor memory device 100, such as a read voltage, a program pulse voltage, various offset information, and a reference voltage for detecting the progressive failure.

Referring to FIG. 4, first to zth memory blocks BLK1 to BLKz are commonly connected to first to mth bit lines BL1 to BLm. In FIG. 2, elements included in the first memory block BLK1 among the plurality of memory blocks BLK1 to BLKz are illustrated, and elements included in each of the other memory blocks BLK2 to BLKz are omitted. It will be understood that each of the other memory blocks BLK2 to BLKz may be configured like the first memory block BLK1.

The memory block BLK1 includes a plurality of cell strings CS1_1 to CS1_m. First to mth cell strings CS1_1 to CS1_m are connected to the first to mth bit lines BL1 to BLm, respectively.

Each of the plurality of first to mth cell strings CS1_1 to CS1_m includes a drain select transistor DST, a plurality of memory cells MC1 to MCn connected in series, and a source select transistor SST. The drain select transistor DST is connected to a drain select line DSL1. First to nth memory cells MC1 to MCn are connected to first to nth word lines WL1 to WLn, respectively. The source select transistor SST is connected to a source select line SSL1. A drain of the drain select transistor DST is connected to a corresponding bit line. The drain select transistors of the first to mth cell strings CS1_1 to CS1_m are connected to the first the mth bit lines BL1 to BLm, respectively. A source of the source select transistor SST is connected to a common source line CSL. As an embodiment, the common source line CSL may be commonly connected to the first to zth memory blocks BLK1 to BLKz.

The drain select line DSL1, the first to nth word lines WL1 to WLn, and the source select line SSL1 are included in the row lines RL of FIG. 3. The drain select line DSL1, the first to nth word lines WL1 to WLn, and the source select line SSL1 are controlled by the address decoder 121. The common source line CSL is controlled by a control logic 125. The first to mth bit lines BL1 to BLm are controlled by the read/write circuit 123.

Referring back to FIG. 3, the peripheral circuit 120 includes the address decoder 121, a voltage generator 122, the read/write circuit 123, an input/output buffer 124, the control logic 125, and a progressive failure detector 126.

The address decoder 121 is connected to the memory cell array 110 through the row lines RL. The address decoder 121 is configured to operate under the control of the control logic 125.

As an embodiment, the address decoder 121 may include an address buffer, a block decoder, a row decoder, and the like.

The address decoder 121 receives a physical block address PA through the control logic 125. A program operation of the semiconductor memory device 100 is performed in units of pages. The physical block address PA provided during the program operation includes at least one of a block address and a row address. A read operation of the semiconductor memory device 100 is performed in units of pages. The physical block address PA provided during the read operation includes at least one of a block address and a row address.

The address decoder 121 is configured to decode a block address in the provided physical block address PA. The address decoder 121 selects one of the memory blocks BLK1 to BLKz according to the decoded block address.

The address decoder 121 is configured to decode a row address in the provided physical block address PA, thereby selecting one word line in the selected memory block. Accordingly, one page is selected.

The address decoder 121 selects one word line of the selected memory block by applying voltages provided form the voltage generator 122 to the row lines RL according to the decoded row address. During the program operation, the address decoder 121 may apply a program pulse to the selected word line, and a pass pulse lower than the program pulse to unselected word lines. During the read operation, the address decoder 121 may apply a read voltage to the selected word line, and apply first and second pass voltages to adjacent unselected word lines.

The voltage generator 122 is configured to generate a plurality of voltages by using an external power voltage supplied to the semiconductor memory device 100. The voltage generator 122 operates under the control of the control logic 125. For example, the voltage generator 122 generates an internal power voltage by regulating the external power voltage. The internal power voltage generated by the voltage generator 122 is provided to the address decoder 121, the read/write circuit 123, the input/output buffer 124, the control logic 125, and the progressive failure detector 126 as an operation voltage of the semiconductor memory device 100.

The voltage generator 122 generates a plurality of voltages by using at least one of the external power voltage and the internal power voltage. As an embodiment, the voltage generator 122 includes a plurality of pumping capacitors for receiving the internal power voltage, and generates a plurality of voltages by selectively activating the plurality of pumping capacitors under the control of the control logic 125. For example, when a read operation is performed, the voltage generator 122 generates a read voltage and a pass voltage higher than or equal to the read voltage. The voltage generator 122 may generate the second pass voltage higher by a reference voltage than the first pass voltage.

The read/write circuit 123 is connected to the memory cell array 110 through the bit lines BL. The read/write circuit 123 operates under the control of the control logic 125.

When the progressive failure detection operation is performed, the read/write circuit 123 reads data DATA from a selected page of the memory cell array 110, and transmits the read data to the progressive failure detector 126.

The input/output buffer 124 is connected to the read/write circuit 123 through data line DL. The input/output buffer 124 operates under the control of the control logic 125. When a program operation is performed, the input/output buffer 124 receives data DATA to be stored from the controller 200.

The control logic 125 is configured to control overall operations of the semiconductor memory device 100. The control logic 125 may receive a command CMD and a physical block address PA. When a read operation is performed, the command CMD may be a read command. When a program operation is performed, the command CMD may be a command indicating the program operation. When an erase operation is performed, the command CMD may be a command indicating the erase operation. The control logic 125 is configured to control the address decoder 121, the voltage generator 122, the read/write circuit 123, the input/output buffer 124, and the progressive failure detector 126 in response to the provided command CMD.

When the program operation is completed, the control logic 125 may control the progressive failure detector 126 to perform the progressive failure detection operation. The control logic 125 controls the voltage generator 122 to apply a read voltage Vread to a selected word line and apply a first pass voltage Vpass1 to adjacent unselected word lines. The first pass voltage may be higher than or equal to the read voltage.

The progressive failure detector 126 detects the progressive failure of the memory cell array 110. The progressive failure detector 126 may include at least one timer circuit therein. The progressive failure detector 126 includes a first timer circuit and a second timer circuit. When a first reference time elapses, the first timer circuit outputs a signal. When a second reference time elapses, the second timer circuit outputs a signal.

When the read voltage and the first pass voltage, which are generated by the voltage generator 122, are applied to the selected word line and the adjacent unselected word lines, respectively, the control logic 125 operates the first timer circuit.

When the first reference time elapses as the operation of the first timer circuit is completed, the progressive failure detector 126 outputs a signal to the control logic 125.

The control logic 125 may apply a second pass voltage Vpass2 to the adjacent unselected word lines by controlling the voltage generator 122 while keeping application of the read voltage to the selected word line. The second pass voltage may be higher than the first pass voltage by a predetermined reference voltage. Here, the reference voltage may be differently determined according to characteristics of the memory cell array 110. The reference voltage may be differently set for each word line. The reference voltage for each word line may be previously stored in the memory cell array 110. For example, the reference voltage may be stored in the CAM area of the memory cell array 110.

When the second pass voltage is applied, the control logic 125 may control the progressive failure detector 126 to operate the second timer circuit. When the second reference time elapses as the operation of the second timer circuit is completed, the control logic 125 may control the read/write circuit 123 to read data corresponding to the selected word line.

When the progressive failure detection operation is performed, the read/write circuit 123 reads data DATA from the selected page of the memory cell array 110, and provides the progressive failure detector 126 with information about whether the read operation passes or fails.

When the read operation fails, the progressive failure detector 126 determines the selected page to have the progressive failure, and transmits the determined result to the control logic 125.

When the read operation passes, the progressive failure detector 126 does not perform any operation or provides the control logic 125 with a signal representing that any progressive failure is not detected.

Figure 5:
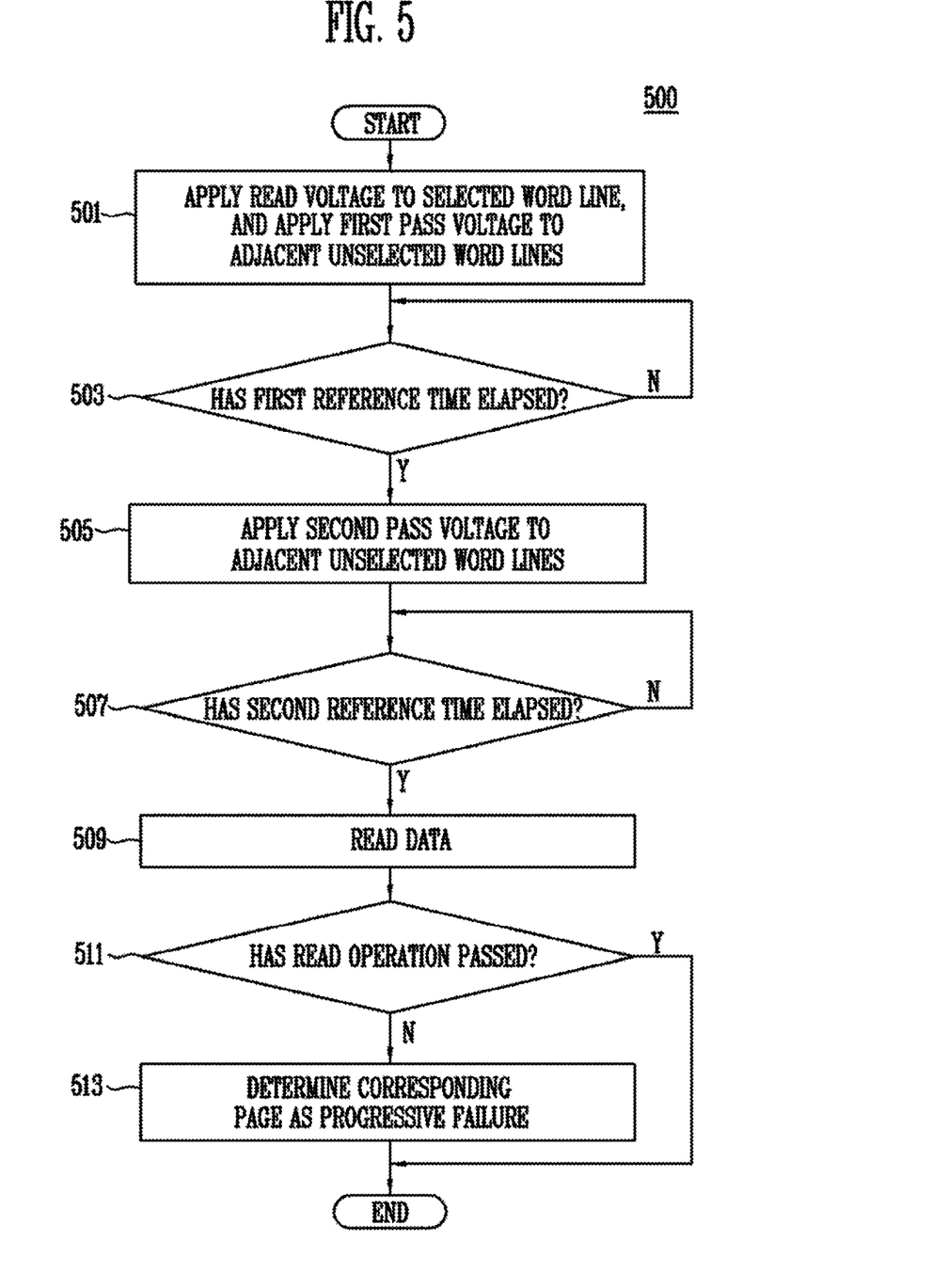
FIG. 5 is a flowchart illustrating an operation of the memory system according to an embodiment of the present disclosure.

FIG. 5 is a flowchart illustrating an operation of the memory system 50 according to an embodiment of the present disclosure.

FIG. 5 shows the progressive failure detection operation 500. The progressive failure detection operation according to the embodiment of the present disclosure may be performed by the semiconductor memory device 100 during the test process after the fabrication of the semiconductor memory device 100. The progressive failure detection operation is performed by programming arbitrary data to a selected word line and reading the programmed data of a page corresponding to the selected word line.

Referring to FIGS. 1 to 5, at step 501, the semiconductor memory device 100 may apply the read voltage to the selected word line, and apply the first pass voltage to the adjacent unselected word lines. The first pass voltage may equal to or higher than the read voltage.

At step 503, the semiconductor memory device 100 may decide whether a first reference time has elapsed. In an embodiment, it may be determined whether the first reference time elapses through the operation of the first timer circuit. During the first reference time, the selected word line and the adjacent unselected word lines are charged with the read voltage and the first pass voltage, respectively. When it is decided that the first reference time has elapsed, the memory system proceeds to step 505.

At step 505, the semiconductor memory device 100 may apply the second pass voltage to the adjacent unselected word lines while keeping application of the read voltage to the selected word line. The second pass voltage may be higher than the first pass voltage by the reference voltage. In various embodiments, the second pass voltage may be higher than the first pass voltage by at least 2V. When the second pass voltage is applied, the potential of the selected word line may be increased due to the coupling effect. As a time elapses, the potential of the selected word line may be returned to the read voltage.

At step 507, the semiconductor memory device 100 may decide whether a second reference time has elapsed. In an embodiment, it may be determined whether the second reference time has elapsed through the operation of the second timer circuit. During the second reference time, the potential of the normal selected word line is returned to the read voltage, as described with reference to FIG. 1. When the second reference time elapses as the decision result, the memory system proceeds to step 509.

At step 509, the semiconductor memory device 100 read data of the selected page connected to the selected word line through the bit lines.

At step 511, the semiconductor memory device 100 may decide whether the read operation of step 509 has passed. When the read operation fails as the decision result, it is highly likely that the progressive failure will occur later during the use of the semiconductor memory device 100.

At step 513, the semiconductor memory device 100 may determine the selected page corresponding to the selected word line to have the progressive failure.

Figure 6:
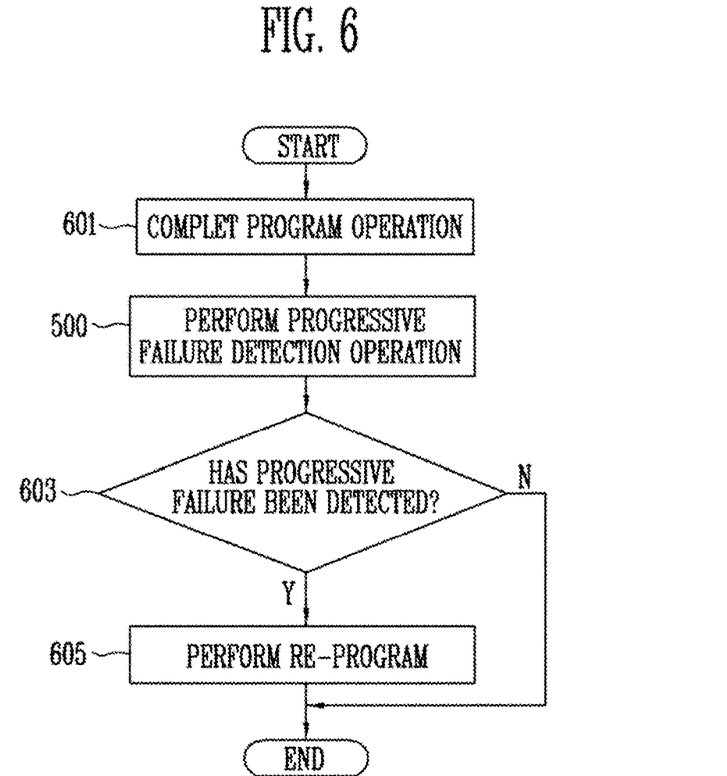
FIG. 6 is a flowchart illustrating an operation of the memory system according to another embodiment of the present disclosure.

FIG. 6 is a flowchart illustrating an operation of the memory system 50 according to another embodiment of the present disclosure.

FIG. 6 illustrates the program operation, the progressive failure detection operation of FIG. 5, and the re-program operation for the detected progressive failure.

Referring to FIGS. 1 to 6, at step 601, the semiconductor memory device 100 completes the program operation in response to the program command from the controller by programming data in a selected page connected to the selected word line.

At step 500, the memory system 50 performs the progressive failure detection operation as described with reference to FIG. 5.

At step 603, it is determined whether the progressive failure is detected. When any progressive failure is not detected, the memory system 50 is immediately ended.

At step 605, when the progressive failure is detected, the memory system 50 may perform the failure processing to the selected page of the progressive failure, and perform the re-program operation for moving the data of the selected page of the progressive failure to another page.

Specifically, the memory system 50 performs the failure processing on the physical address of the selected page of the progressive failure, and searches a logical address information mapped to the physical address of the selected page of the progressive failure, thereby changing the mapped physical address. The memory system 50 may update the mapping table to store the changed physical address.

In an embodiment, the memory system 50 may separately store information on the selected page of the progressive failure in the bad block table. The memory system 50 may perform the re-program operation of for moving the data of the page corresponding to the selected word line to another memory region corresponding to the changed physical address.

According to the embodiment of the present disclosure, it is possible to detect the progressive failure for each word line. Thus, the failure processing can be performed in units of pages.

In an embodiment, the failure processing may be performed on the entire memory block including the selected page of the progressive failure. In this case, if data is stored in the remaining pages of the entire memory block other than the selected page of the progressive failure, the memory system 50 may move the data of the remaining pages of the memory block to another memory block of the memory cell array 110.

Figure 7:
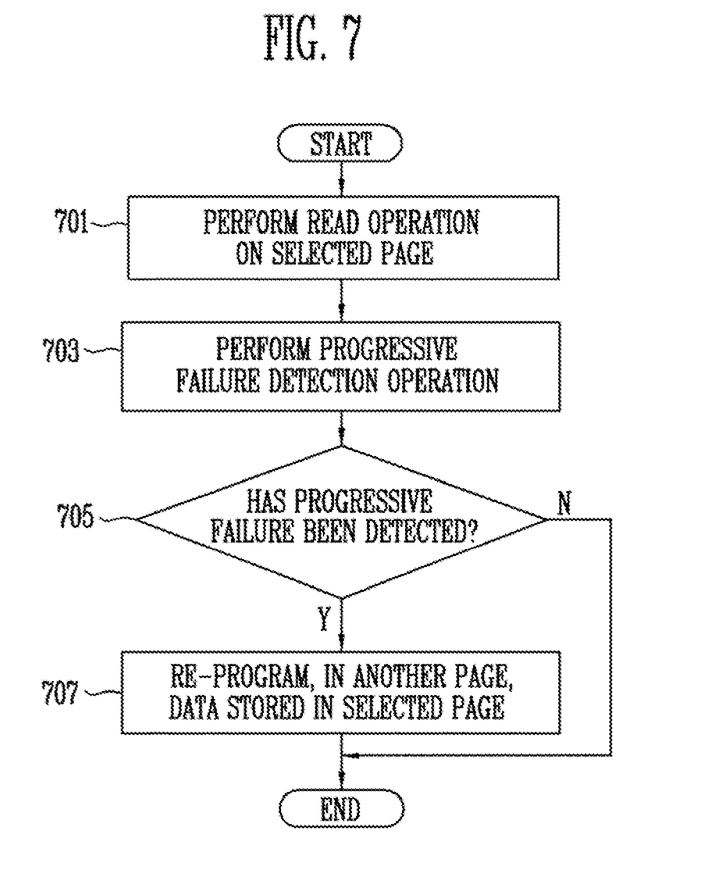
FIG. 7 is a flowchart illustrating an operation of the memory system according to another embodiment of the present disclosure.

FIG. 7 is a flowchart illustrating an operation of the memory system 50 according to still another embodiment of the present disclosure.

FIG. 7 shows the progressive failure detection operation after the read operation.

Referring to FIGS. 1 to 5 and 7, at step 701, the semiconductor memory device 100 performs the read operation to a selected page in response to a read command and a physical address of the selected page from the controller 200.

At step 703, after the read operation, the semiconductor memory device 100 may perform the progressive failure detection operation as described with reference to FIG. 5.

Thus, although the read operation currently passes at step 701, the progressive failure, which will occur during the later use of the semiconductor memory device 100, can be detected in advance according to the progressive failure detection operation.

At step 705, it may be decided whether the selected page is determined to have the progressive failure as a result of the progressive failure detection operation of step 703. The semiconductor memory device 100 ends the process when any progressive failure is not detected.

When the selected page is determined to have the progressive failure at step 705, the semiconductor memory device 100 may perform the re-program operation of moving the data of the selected page of the progressive failure to another page at step 707. In this case, the controller 200 may provide the semiconductor memory device 100 with a physical address corresponding to another page to which the data of the selected page of the progressive failure is to be moved and the re-program command. The semiconductor memory device 100 performs the re-program operation in response to the provided re-program command.

In various embodiments, the semiconductor memory device 100 may store, in a page buffer, the data of the selected page where the read operation of step 701 passes, and then perform the re-program operation to move the data stored in the buffer to another page at step 707 when it is determined that the progressive failure is detected in the selected page at step 705.

In an embodiment, when the controller 200 receives information representing the detection of the progressive failure in the selected page from the semiconductor memory device 100, the controller 200 may perform the failure processing on a physical address of the selected page of the progressive failure. Specifically, when the controller 200 receives information representing the detection of the progressive failure in the selected page from the semiconductor memory device 100, the controller 200 performs the failure processing on the physical address of the selected page of the progressive failure, and searches a logical address information mapped to the physical address of the selected page of the progressive failure, thereby changing the mapped physical address. The controller 200 may update the mapping table to store the changed physical address.

In an embodiment, the controller 200 may separately store information on the selected page of the progressive failure in the bad block table. The controller 200 may control the semiconductor memory device 100 to perform the re-program operation for moving the data of the selected page of the progressive failure to another memory region corresponding to the changed physical address. In this case, the controller 200 may provide the semiconductor memory device 100 with a physical address corresponding to another page to which the data of the selected page of the progressive failure is to be moved as well as the re-program command. The semiconductor memory device 100 performs the re-program operation in response to the provided re-program command.

Figure 8:
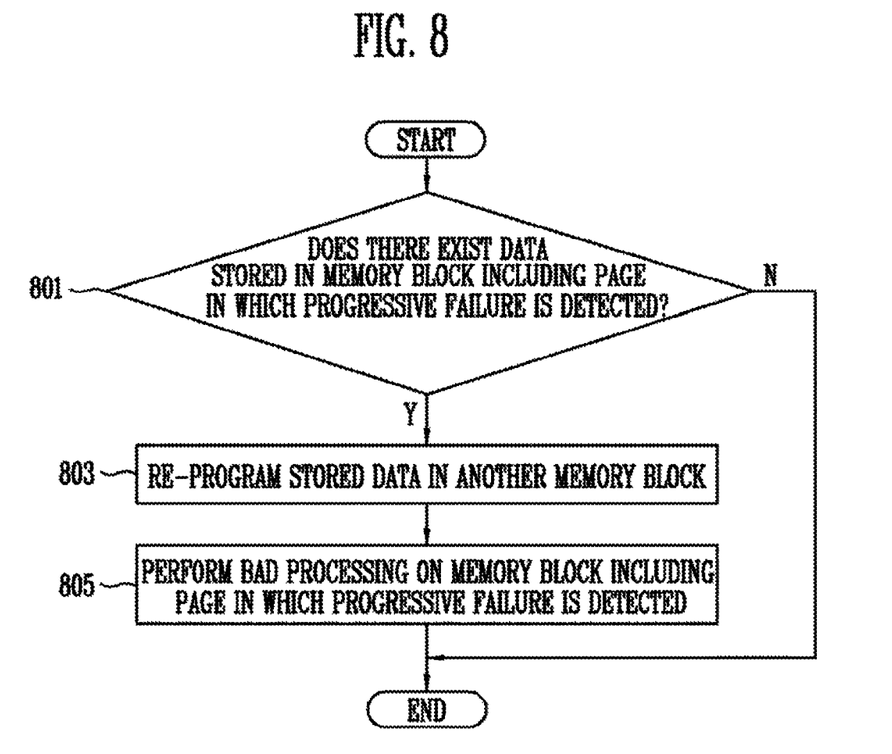
FIG. 8 is a flowchart illustrating a method of processing a detected progressive failure according to an embodiment of the present disclosure.

FIG. 8 is a flowchart illustrating a method of processing the detected progressive failure according to an embodiment of the present disclosure.

According to the embodiment of the present disclosure, since the progressive failure is detected for each word line, the failure processing may be performed in units of pages for the detected progressive failure. Data stored in the selected page, to which the failure processing is performed for the detected progressive failure, may be stored in a page buffer and then re-programmed to another page.

When the progressive failure is detected in a portion of a plurality of pages included in a memory block, the progressive failure may occur in the entire memory block during later use of the semiconductor memory device 100. Therefore, in terms of the reliability of the semiconductor memory device 100, the failure processing may be performed on the entire memory block including the selected page of the progressive failure.

Referring to FIG. 8, at step 801, the memory system 50 may decide whether the memory block of the progressive failure stores data. In the entire block, data may be stored in the selected page of the progressive failure as well as in the remaining pages of the entire memory block other than the selected page of the progressive failure. When the memory block of the progressive failure is determined to store data as the decision result at step 801, the memory system 50 proceeds to step 803. Otherwise, the memory system 50 ends the process.

At step 803, the memory system 50 may perform the re-program operation to move the data of the memory block of the progressive failure to another memory block of the memory cell array 110. The memory system 50 may store, in the page buffer, the data stored in the selected page during the progressive failure detection operation, and then perform the re-program operation to move the data of the selected page of the progressive failure to another memory block of the memory cell array 110 when the progressive failure is detected in the selected page during the progressive failure detection operation.

At step 805, the memory system 50 may perform the failure processing on the physical address of the entire memory block including the selected page of the progressive failure. As well as step 803 of moving the data of the memory block of the progressive failure to another memory block, memory system 50 may also perform the re-program operation to move the data stored in the remaining pages of the entire memory block other than the selected page of the progressive failure to another memory block of the memory cell array 110. When the controller 200 receives information representing the detection of the progressive failure in the selected page from the semiconductor memory device 100, the controller 200 may perform the failure processing on a physical address of the entire memory block including the selected page of the progressive failure, and searches a logical address information mapped to the physical address of the memory block of the progressive failure, thereby changing the mapped physical address. The controller 200 may update the mapping table to store the changed physical address.

In an embodiment, the controller 200 may separately store information on the memory block of the progressive failure in the bad block table. The controller 200 may control the semiconductor memory device 100 to perform the re-program operation of for moving the data of the memory block of the progressive failure to another memory region corresponding to the changed physical address. In this case, the controller 200 may provide the semiconductor memory device 100 with a physical address corresponding to another memory block to which the data of the memory block of the progressive failure is to be moved and the re-program command. The semiconductor memory device 100 performs the re-program operation in response to the provided re-program command.

Figure 9:
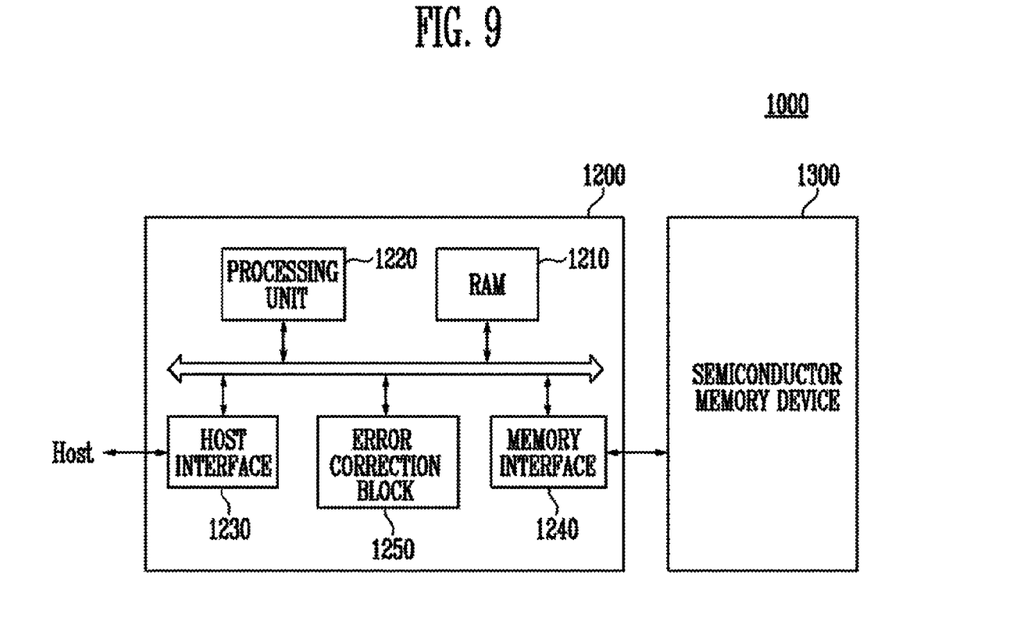
FIG. 9 is a block diagram illustrating another embodiment of the memory system including the semiconductor memory device of FIG. 3.

FIG. 9 is a block diagram illustrating a memory system 1000 including the semiconductor memory device 100 of FIG. 3.

Referring to FIG. 9, the memory system 1000 includes a semiconductor memory device 1300 and a controller 1200.

The semiconductor memory device 1300 may be configured and operated identically to the semiconductor memory device 100 of FIG. 2. Hereinafter, overlapping descriptions will be omitted.

The controller 1200 is connected to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the semiconductor memory device 1300 and the host Host. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls overall operations of the controller 1200.

The processing unit 1220 is configured to randomize data provided from the host Host. For example, the processing unit 1220 may randomize the data provided from the host Host by using a randomizing seed. The randomized data is provided as data DATA to be stored to the semiconductor memory device 1300, to be programmed to the memory cell array.

The processing unit 1220 is configured to derandomize data provided from the semiconductor memory device 1300 in a read operation is performed. For example, the processing unit 1220 may derandomize the data provided from the semiconductor memory device 50 by using a derandomizing seed. The derandomized data may be output to the host Host.

As an embodiment, the processing unit 1220 may perform randomizing and derandomizing by driving software or firmware.

The host interface 1230 includes a protocol for exchanging data between the host Host and the controller 1200. As an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 1300. For example, the memory interface 1240 may include a NAND interface or a NOR interface.

The error correction block 1250 is configured to detect and correct an error of data provided from the semiconductor memory device 1300 by using an error correction code (ECC).

The controller 1200 and the semiconductor memory device 1300 may be integrated into one semiconductor device. As an embodiment, the controller 1200 and the semiconductor memory device 1300 may be integrated into one semiconductor device, to constitute a memory card. For example, the controller 1200 and the semiconductor memory device 1300 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 1300 may be integrated into one semiconductor device to constitute a semiconductor drive (solid state drive (SSD)). The semiconductor drive SSD includes a storage device configured to store data in a semiconductor memory. When the memory system 1000 is used as the semiconductor drive SSD, the operating speed of the host Host connected to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

As an embodiment, the semiconductor memory device 1300 or the memory system 1000 may be packaged in various forms. For example, the semiconductor memory device 1300 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
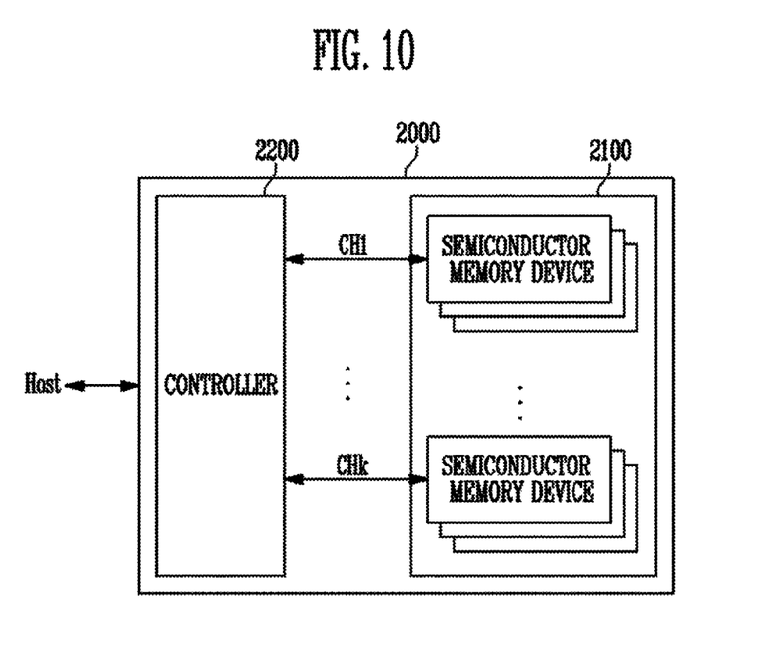
FIG. 10 is a block diagram illustrating an application example of the memory system of FIG. 9.

FIG. 10 is a block diagram illustrating an application example 2000 of the memory system 1000 of FIG. 9.

Referring to FIG. 10, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 10, it is illustrated that the plurality of groups communicate with the controller 2200 through first to kth channels CH1 to CHk. Each semiconductor memory chip may be configured and operate like any one of the semiconductor memory devices 100 described with reference to FIG. 3.

Each group is configured to communicate with the controller 2200 through one common channel. The controller 2200 is configured similarly to the controller 1200 described with reference to FIG. 9. The controller 2200 is configured to control the plurality of memory chips of the semiconductor memory device 2100 through the plurality of channels CH1 to CHk.

In FIG. 10, it has been illustrated that a plurality of semiconductor memory chips are connected to one channel. However, it will be understood that the memory system 2000 may be modified such that one semiconductor memory chip is connected to one channel.

Figure 11:
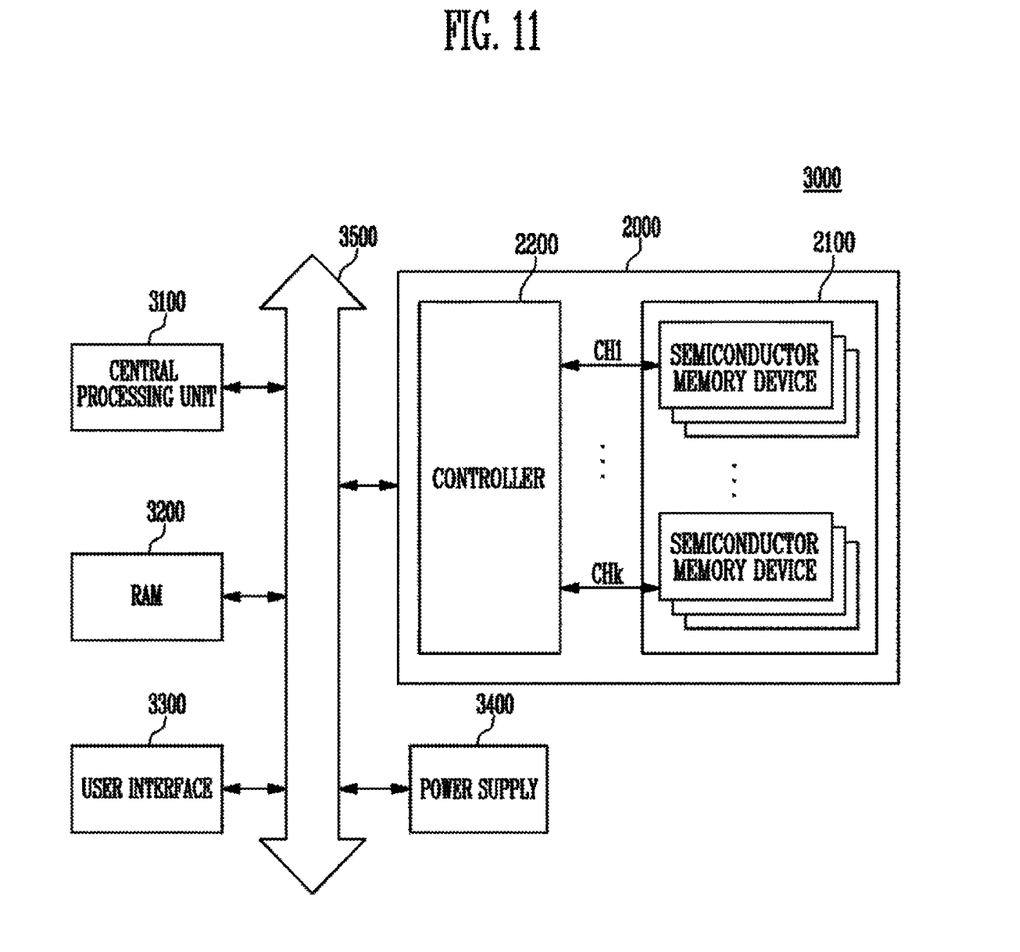
FIG. 11 is a block diagram illustrating a computing system including the memory system described with reference to FIG. 10.

FIG. 11 is a block diagram illustrating a computing system 3000 including the memory system 2000 described with reference to FIG. 10.

Referring to FIG. 11, the computing system 300 includes a central processing unit 3100, a random access memory (RAM) 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 11, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 11, it is illustrated that the memory system 2000 described with reference to FIG. 10 is provided. However, the memory system 2000 may be replaced by the memory system 1000 described with reference to FIG. 9. As an embodiment, the computing system 3000 may be configured to include both the memory systems 1000 and 2000 described with reference to FIGS. 9 and 10.

According to the present disclosure, it is possible to a memory system and an operating method thereof, which can detect a progressive failure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a semiconductor memory device, the method comprising:
   applying a read voltage to a selected word line on which a program operation is performed;
   applying a first pass voltage to at least one unselected word line adjacent to the selected word line;
   applying a second pass voltage to the at least one unselected word line in response to a first reference time elapsing after the applying of the first pass voltage;
   performing a read operation to memory cells connected to the selected word line according to the read voltage in response to a second reference time elapsing after the applying of the second pass voltage; and
   determining the memory cells connected to the selected word line to have a progressive failure when the read operation fails.

2. The method of claim 1, wherein the first pass voltage is equal to or higher than the read voltage.

3. The method of claim 1, wherein the second pass voltage is higher than the first pass voltage by a reference voltage.

4. The method of claim 1, wherein the first reference time is of a length sufficient for the selected word line and the at least one unselected word line to be charged with the read voltage and the first pass voltage, respectively.

5. The method of claim 1, wherein the second reference time is of a length sufficient for the selected word line to recover a coupling effect between word lines by returning to the read voltage when the memory cells connected to the selected word line do not have any progressive failure.

6. A semiconductor memory device, comprising:
   a memory cell array connected to a plurality of word lines; and
   a peripheral circuit performing a progressive failure detection operation to memory cells connected to a selected word line among the plurality of word lines,
   wherein the peripheral circuit applies a read voltage to a selected word line on which a program operation is performed, applies a first pass voltage to at least one unselected word line adjacent to the selected word line, applies a second pass voltage to the at least one unselected word line when a first reference time elapses after the applying of the first pass voltage, performs a read operation to memory cells connected to the selected word line according to the read voltage when a second reference time elapses after the applying of the second pass voltage and determines the memory cells connected to the selected word line to have a progressive failure when the read operation fails.

7. The semiconductor memory device of claim 6, wherein the first pass voltage is equal to or higher than the read voltage.

8. The semiconductor memory device of claim 6, wherein the second pass voltage is higher than the first pass voltage by a reference voltage.

9. The semiconductor memory device of claim 6, wherein the first reference time is of a length sufficient for memory cells connected to the selected word line and the at least one unselected word line to be charged with the read voltage and the first pass voltage, respectively.

10. The semiconductor memory device of claim 6, wherein the second reference time is of a length sufficient for the selected word line to recover a coupling effect between word lines by returning to the read voltage when the memory cells connected to the selected word line do not have any progressive failure.

11. A method of operating a memory system, the method comprising:
   performing a program operation to memory cells connected to a selected word line; and
   performing a progressive failure detection operation to the memory cells connected to the selected word line,
   wherein the performing of the progressive failure detection operation includes:
   applying a read voltage to the selected word line;
   applying a first pass voltage to at least one unselected word line adjacent to the selected word line;
   applying a second pass voltage to the at least one unselected word line when a first reference time elapses after the applying of the first pass voltage;

performing a read operation on the memory cells connected to the selected word line according to the read voltage when a second reference time elapses after the applying of the second pass voltage; and determining the memory cells connected to the selected word line to have a progressive failure when the read operation fails.

12. The method of claim 11, wherein the first pass voltage is equal to or higher than the read voltage.

13. The method of claim 11, wherein the second pass voltage is higher than the first pass voltage by a reference voltage.

14. The method of claim 11, wherein the first reference time is of a length sufficient for the selected word line and the at least one unselected word line to be charged with the read voltage and the first pass voltage, respectively.

15. The method of claim 11, wherein the second reference time is of a length sufficient for the selected word line to recover a coupling effect between word lines by returning to the read voltage when the memory cells connected to the selected word line do not have any progressive failure.

16. The method of claim 11, further comprising performing a re-program operation of moving data of the memory cells connected to the selected word line to another memory region.

17. The method of claim 11, further comprising performing a progressive failure processing to a memory block including memory cells connected to the selected word line.

* * * * *